(12) United States Patent
Xu

(10) Patent No.: US 9,165,950 B2
(45) Date of Patent: Oct. 20, 2015

(54) ANTI-STATIC STRUCTURE OF ARRAY SUBSTRATE

(71) Applicant: Shenzhen China Star Optoelectronics Technology Co., Ltd., Shenzhen, Guangdong (CN)

(72) Inventor: Xiangyang Xu, Shenzhen (CN)

(73) Assignee: Shenzhen China Star Optoelectronics Technology Co., Ltd., Shenzhen, Guangdong ( * ) Notice: Subject to any disclaimer, the term of this patent is extended or adjusted under 35 U.S.C. 154(b) by 0 days.

(21) Appl. No.: 14/347,596

(22) PCT Filed: Jan. 21, 2014

(86) PCT No.: PCT/CN2014/070966
§ 371 (c)(1),
(2) Date: Mar. 26, 2014

(87) PCT Pub. No.: WO2015/096247
PCT Pub. Date: Jul. 2, 2015

(65) Prior Publication Data
US 2015/0187801 A1    Jul. 2, 2015

(30) Foreign Application Priority Data
Dec. 26, 2013  (CN) .......................... 2013 1 0733696

(51) Int. Cl.
*H01L 27/12* (2006.01)
*H01L 27/02* (2006.01)
*H01L 23/60* (2006.01)
*H01L 21/66* (2006.01)
*H01L 23/58* (2006.01)

(52) U.S. Cl.
CPC .............. *H01L 27/124* (2013.01); *H01L 22/32* (2013.01); *H01L 23/585* (2013.01); *H01L 23/60* (2013.01); *H01L 27/0248* (2013.01)

(58) Field of Classification Search
None
See application file for complete search history.

(56) References Cited

U.S. PATENT DOCUMENTS

| | | | |
|---|---|---|---|
| 2002/0101547 A1* | 8/2002 | Lee et al. ......................... | 349/40 |
| 2007/0030408 A1* | 2/2007 | Lin et al. ......................... | 349/40 |
| 2010/0163880 A1* | 7/2010 | Jeon ............................... | 257/59 |
| 2011/0095290 A1* | 4/2011 | Koo et al. ........................ | 257/48 |
| 2014/0168559 A1* | 6/2014 | Zhu et al. ......................... | 349/43 |

\* cited by examiner

*Primary Examiner* — Mamadou Diallo
(74) *Attorney, Agent, or Firm* — Andrew C. Cheng

(57) ABSTRACT

The present invention provides an anti-static structure of an array substrate, which comprises: an effective region 20 of the array substrate, a gate line shorting bar 30 and a data line shorting bar 40, the effective region 20 of the array substrate is provided with a plurality of parallel gate lines 22 and data lines 24, the gate line shorting bar 30 is electrically connected with one side of the plurality of gate lines 22, the data line shorting bar 40 is electrically connected with one side of the plurality of data lines 24. The present invention only utilizes a gate line shorting bar to short all gate lines and utilizes a data line shorting bar to short all data lines, in order to greatly avoid the abnormal discharge of the plasma generated when the hole is formed cause static damage to the metal overlapping traces of the shorting bar.

14 Claims, 5 Drawing Sheets

ANTI-STATIC STRUCTURE OF ARRAY SUBSTRATE

BACKGROUND OF THE INVENTION

1. Field of the Invention

The present invention relates to the display technical field, and in particular to an anti-static structure of an array substrate.

2. The Related Arts

Liquid Crystal Display, LCD, has many advantages such as thin body, power saving, no radiation and so on, which has been widely applied. The liquid crystal display in the conventional market is mostly backlight type liquid crystal display device, which comprises a housing, a liquid crystal display panel provided in the housing and a backlight module provided in the housing and related to the liquid crystal display panel, the working principle of the liquid crystal display panel is to place liquid crystal molecules between two parallel glass substrates, and apply a driving voltage to both glass substrates to control the rotation of the liquid crystal molecules, thereby refracting the light of the backlight module and generating the screen.

Electro-Static discharge, ESD, has been an open question in the semiconductor manufacturing industry, it causes the reduction of product yield, cost increasing, productivity decreasing. In the manufacturing process of the liquid crystal display device, electro-static discharge also has affected the quality of liquid crystal display device, in particular to the liquid crystal display panel production process. Generation of electro-static discharge can be divided into three major factors:

First is particle, any kind of particles can cause damage to the device, even cause the product obsolescence, therefore, in the semiconductor manufacturing process, controlling the particle is an important job.

Second is process conditions and materials, in the process of the liquid crystal display panel manufacturing process, deposition process, photo process, etch process, strip process, clean process and so on, such these manufacturing processes can generate the electro-static discharge, at the same time, the material used in these manufacturing processes can also generate the electro-static discharge due to material defects.

Third is design factor, product design directly affects the situation of static electricity.

In order to improve the product quality, decrease the production cost, static protection work is necessary in the liquid crystal display panel production process. The static protection includes two categories: first is the liquid crystal display panel internal device protection, it is mainly to provide a ESD ring in the beginning and the end of the gate line and the data line of the liquid crystal display panel; second is liquid crystal display panel external circuit protection, it is mainly to protect the damage of ESD to the external circuit in the array process and the back-end process.

In the conventional structure of the TFT array substrate, the film sequence is gate/com-GI-active-S/D-PVX-indium tin oxides, ITO, in order to control the product cost and yield, it usually lights and grades the panel after finishing cutting in the cell process, thereby inputting the qualified liquid crystal display panel to the module.

In order to achieve lighting in the cell process, and not affecting the normal lighting in the module process, it usually adds some simple test circuit in the terminals of the gate line and the data line in the production process of the array substrate, namely setting the shorting bar, thus achieving lighting in the cell process, reduce electro-static discharge phenomena. The current shorting bar is divided into two structures, trimming structure and switching structure. Trimming structure is to directly short the gate line and the data line to the shorting bar, after finishing the cell test, it needs to disconnect the shorting bar and the terminals of the gate line and the data line by laser; the switching structure is to input the shorting bar signal into the gate line and the date line by switching.

In terms of the trimming structure, currently, it uses five shorting bars to respectively connect with the corresponded signal line, wherein three shorting bars are connected with data line (respectively connected with R, G, B data lines), two shorting bars are connected with gate line (respectively connected with odd and even gate lines), these shorting bars 100 are connected with the gate line or data line 200 through the hole, as shown in FIG. 1. However, in the dry etching of the insulating protective layer and the active layer of the liquid crystal display panel, the abnormal discharge of the plasma would still cause static damage to the metal overlapping traces of the shorting bar 100, affecting the product quality.

SUMMARY OF THE INVENTION

The purpose in the present invention is to provide an anti-static structure of an array substrate, in the manufacturing process of the array substrate, especially when the insulating protective layer and the active layer perform the dry etching, it can greatly avoid the abnormal discharge of the plasma generated when the hole is formed cause static damage to the metal overlapping traces of the shorting bar, improving the product quality, increasing the production efficiency, reducing the production cost.

In order to achieve the above purpose, the present invention provides an anti-static structure of an array substrate, which comprises an effective region of the array substrate, a gate line shorting bar provided on one side of the effective region and a data line shorting bar provided on the other side of the effective region, one side of the effective region where providing the gate line shorting bar being adjacent to the other side where providing the data line shorting bar, the effective region of the array substrate being provided with a plurality of parallel gate lines and data lines, the gate line shorting bar being electrically connected with one side of the plurality of gate lines, the data line shorting bar being electrically connected with one side of the plurality of data lines.

The plurality of gate lines and the plurality data lines are perpendicular to each other, the beginning and the end of each gate lines and data lines are provided anti-static rings, the anti-static ring is provided around the effective region of the array substrate.

All anti-static rings around the effective region of the array substrate are electrically connected together.

The anti-static structure of an array substrate also comprises a plurality of first fan-out lines, a plurality of second fan-out lines, a plurality of data line contact pads and a plurality of gate line contact pads, one side of each first fan-out lines being electrically connected with a data line contact pad, the other end being electrically connected with a data line, one side of each second fan-out lines being electrically connected with a gate line contact pad, the other end being electrically connected with a gate line.

The gate line shorting bar is electrically connected with each gate line contact pads to short all of the gate lines; the data line shorting bar is electrically connected with each data line contact pads to short all of the data lines.

The gate line shorting bar comprises a substrate, a first metal layer forming on the substrate, a gate insulator covering on the first metal layer and the substrate and a passivation layer on the gate insulator.

The first metal layer of the gate line shorting bar is produced at same layer and directly connected with the plurality of gate lines, further electrically connecting the gate line shorting bar and the plurality of gate lines.

The data line shorting bar comprises a substrate, a gate insulator forming on the substrate, a second metal layer on the top of the gate insulator and a passivation layer covering on the second metal layer and the gate insulator.

The second metal layer of the data line shorting bar is produced at same layer and directly connected with the plurality data lines, further electrically connecting the data line shorting bar and the plurality of data lines.

One end of the gate line shorting bar has a gate signal input pad, which is used to input the test signal; one end of the data line shorting bar has a data signal input pad, which is used to input the test signal.

The present invention also provides an anti-static structure of an array substrate, which comprises an effective region of the array substrate, a gate line shorting bar provided on one side of the effective region and a data line shorting bar provided on the other side of the effective region, one side of the effective region where providing the gate line shorting bar being adjacent to the other side where providing the data line shorting bar, the effective region of the array substrate being provided with a plurality of parallel gate lines and data lines, the gate line shorting bar being electrically connected with one side of the plurality of gate lines, the data line shorting bar being electrically connected with one side of the plurality of data lines;

Wherein, the plurality of gate lines and the plurality data lines are perpendicular to each other, the beginning and the end of each gate lines and data lines are provided anti-static rings, the anti-static ring is provided around the effective region of the array substrate;

Wherein, all anti-static rings around the effective region of the array substrate are electrically connected together;

It also comprises a plurality of first fan-out lines, a plurality of second fan-out lines, a plurality of data line contact pads and a plurality of gate line contact pads, one side of each first fan-out lines being electrically connected with a data line contact pad, the other end being electrically connected with a data line, one side of each second fan-out lines being electrically connected with a gate line contact pad, the other end being electrically connected with a gate line;

Wherein, the gate line shorting bar is electrically connected with each gate line contact pads to short all of the gate lines; the data line shorting bar is electrically connected with each data line contact pads to short all of the data lines;

Wherein, the gate line shorting bar comprises a substrate, a first metal layer forming on the substrate, a gate insulator covering on the first metal layer and the substrate and a passivation layer on the gate insulator.

The first metal layer of the gate line shorting bar is produced at same layer and directly connected with the plurality of gate lines, further electrically connecting the gate line shorting bar and the plurality of gate lines.

The data line shorting bar comprises a substrate, a gate insulator forming on the substrate, a second metal layer on the top of the gate insulator and a passivation layer covering on the second metal layer and the gate insulator.

The second metal layer of the data line shorting bar is produced at same layer and directly connected with the plurality data lines, further electrically connecting the data line shorting bar and the plurality of data lines.

One end of the gate line shorting bar has a gate signal input pad, which is used to input the test signal; one end of the data line shorting bar has a data signal input pad, which is used to input the test signal.

The benefits of the present invention is: the anti-static structure of an array substrate in the present invention only utilize a gate line shorting bar to connect with all gate lines and a data line shorting bar to connect with all data lines, greatly briefing the shorting bar circuit, decreasing the number of shorting bar, reducing the number of the lighting signal in the cell process, furthermore, the first metal layer of the gate line shorting bar is produced at same layer and directly connected with the plurality of gate lines, thereby electrically connecting the gate line shorting bar and the plurality of gate lines, the second metal layer of the data line shorting bar is produced at same layer and directly connected with the plurality of the data lines, in this way, in the manufacturing process of the array substrate, especially when the insulating protective layer and the active layer perform the dry etching, it can greatly avoid the abnormal discharge of the plasma generated when the hole is formed cause static damage to the metal overlapping traces of the shorting bar, greatly playing the role of ESD protection, improving the product quality, increasing the production efficiency, reducing the production cost.

In order to further understand the features and the technical contents of the present invention, referring to the following detailed description and the accompanying drawings of the present invention, however, the accompanying drawings are only provided for reference and description, not intending to limit the present invention.

BRIEF DESCRIPTION OF THE DRAWINGS

The following description combines the drawings, through describing in detail the embodiments in the present invention, making the technical solutions and other beneficial effect in the present invention more obvious.

In the drawings.

DETAILED DESCRIPTION OF THE PREFERRED EMBODIMENTS

In order to further illustrate the techniques adopted by the present invention and its effects, the following combines the preferred embodiment of the present invention and its accompanying drawings to describe in detail.

The present invention is described in VA display mode, but not limited to VA display mode.

Figure 1:
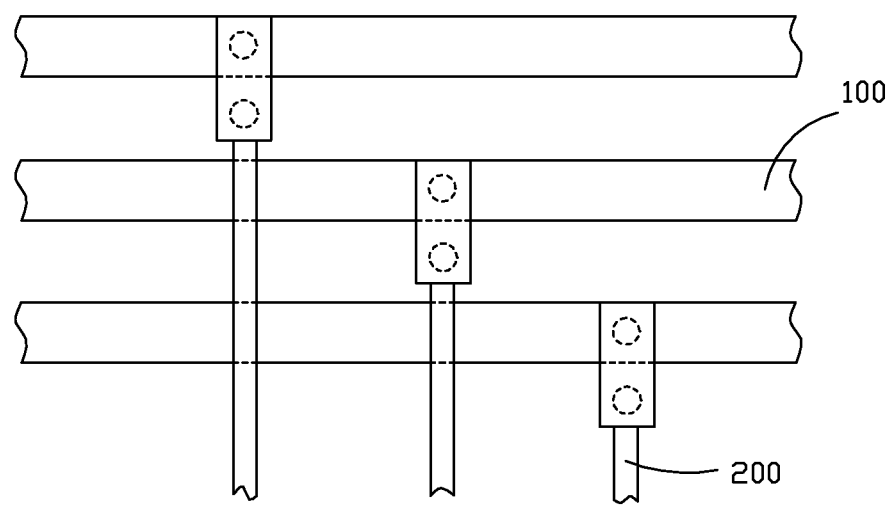
FIG. 1 is a structure diagram of an anti-static structure of an array substrate in the prior art.
Figure 2:
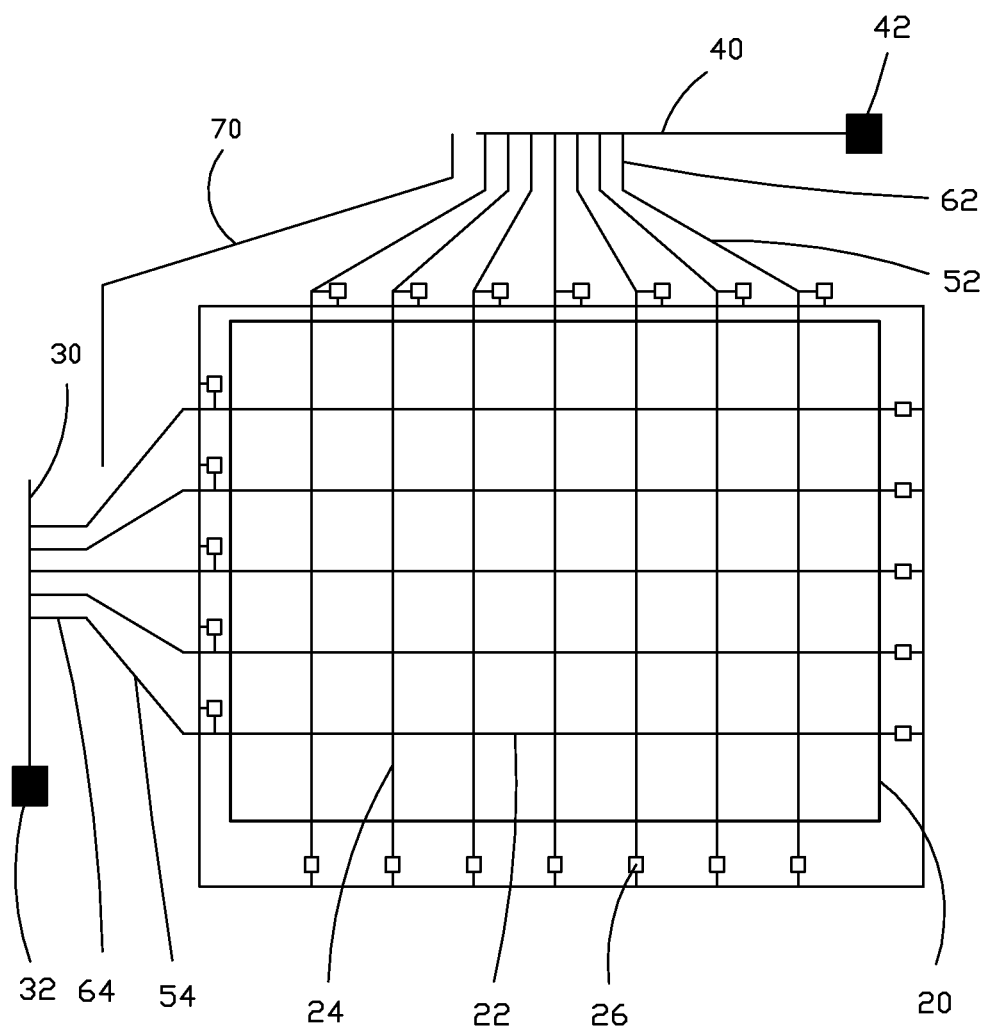
FIG. 2 is a structure diagram of an anti-static structure of an array substrate in the present invention.
Figure 3:
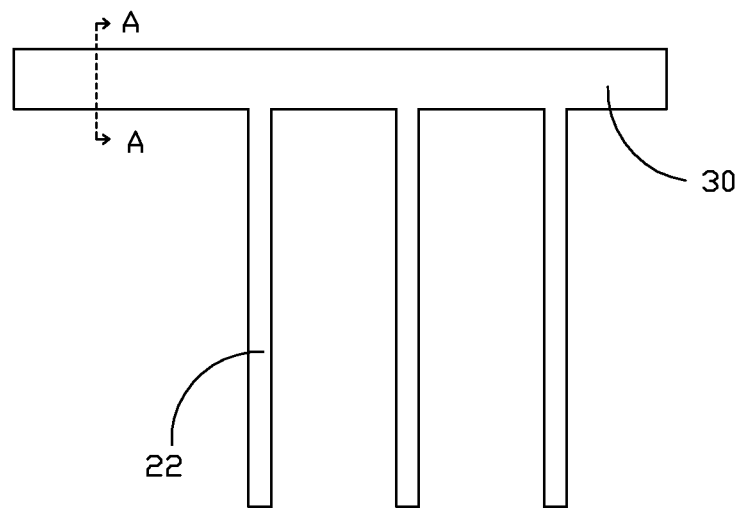
FIG. 3 is a partially enlarged view of the gate line shorting bar in the anti-static structure of the array substrate in the present invention.
Figure 4:
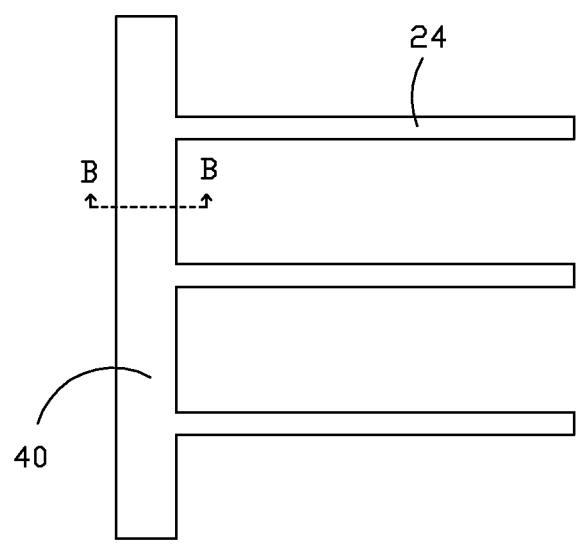
FIG. 4 is a partially enlarged view of the data line shorting bar in the anti-static structure of the array substrate in the present invention.
Figure 7:
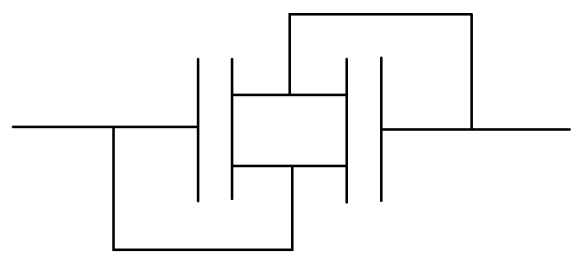
FIG. 7 is an equivalent circuit diagram of an ESD ring in the anti-static structure of the array substrate in the present invention.

Referring to FIG. 2 to FIG. 4, the present invention provides an anti-static structure of an array substrate, which specifically comprises: an effective region 20 of the array substrate, a gate line shorting bar 30 provided on one side of the effective region 20 and a data line shorting bar 40 provided on the other side of the effective region 20, the effective region 20 of the array substrate is provided with a plurality of parallel gate lines 22 and data lines 24, the gate line shorting bar 30 is electrically connected with one side of the plurality of gate lines 22, the data line shorting bar 40 is electrically connected with one side of the plurality of data lines 24. The present invention only utilizes a gate line shorting bar 30 to short all gate lines 22 and utilizes a data line shorting bar 40 to short all data lines 24 in order to achieve the external circuit protection of the panel, greatly simplifying the circuit shorting bar, reducing the number of the shorting bar, decreasing the number of the lighting signal in the cell process. Preferably, the plurality of gate lines 22 and the plurality data lines 24 are perpendicular to each other, meanwhile, one side of the effective region 20 where providing the gate line shorting bar 30 is adjacent to the other side where providing the data line shorting bar 40. The beginning and the end of each gate lines 22 and data lines 24 are provided anti-static rings 26, these anti-static rings 26 are provided around the effective region 20 of the array substrate in order to achieve the internal component ESD protection of the panel. In the present embodiment, all anti-static rings 26 around the effective region 20 of the array substrate are electrically connected together in order to achieve better anti-static effect. Wherein, the equivalent circuit of each anti-static rings 26 as show in FIG. 7, the anti-static ring 26 is composed by two capacitors and the both capacitors are connected with each other in parallel.

The anti-static structure of an array substrate also comprises a plurality of first fan-out lines 52, a plurality of second fan-out lines 54, a plurality of data line contact pads 62 and a plurality of gate line contact pads 64, one side of each first fan-out lines 52 is electrically connected with a data line contact pad 62, the other end is electrically connected with a data line 24, one side of each second fan-out lines 54 is electrically connected with a gate line contact pad 24, the other end is electrically connected with a gate line 22. The gate line shorting bar 30 is electrically connected with each gate line contact pads 64 to short all of the gate lines 22; the data line shorting bar 40 is electrically connected with each data line contact pads 62 to short all of the data lines 24. Wherein, the number of the first fan-out line 52 and the number of the data line contact pad 62 are equal to the number of the data line 24; the number of the second fan-out line 54 and the number of the gate line contact pad 64 are equal to the number of the gate line 22. One end of the gate line shorting bar 30 has a gate signal input pad 32, which is used to input the test signal; one end of the data line shorting bar 40 has a data signal input pad 42, which is used to input the test signal, thereby completing the cell lighting test.

The anti-static structure of an array substrate also comprises a propel link gate, PLG, trace 70 provided in the edge of the array substrate, it is mainly used to transmit the integrated circuit output signal to the gate line.

Figure 5:
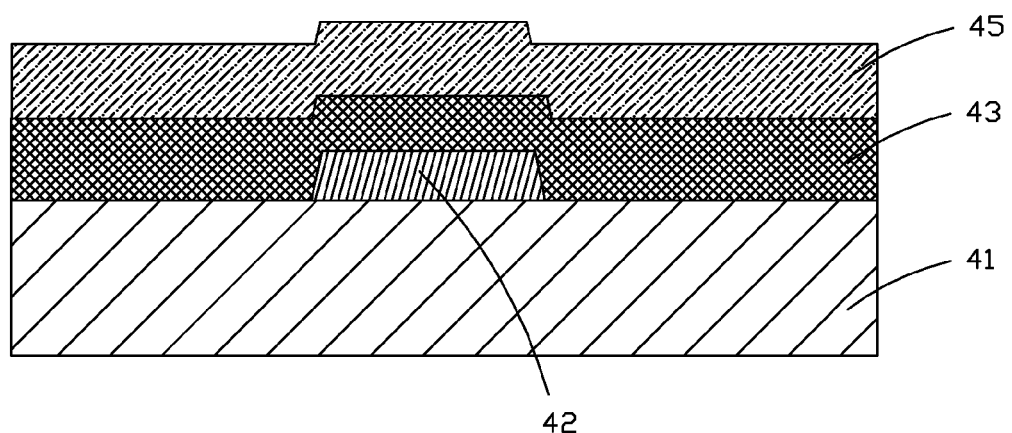
FIG. 5 is a cross section of A-A in FIG. 3.
Figure 6:
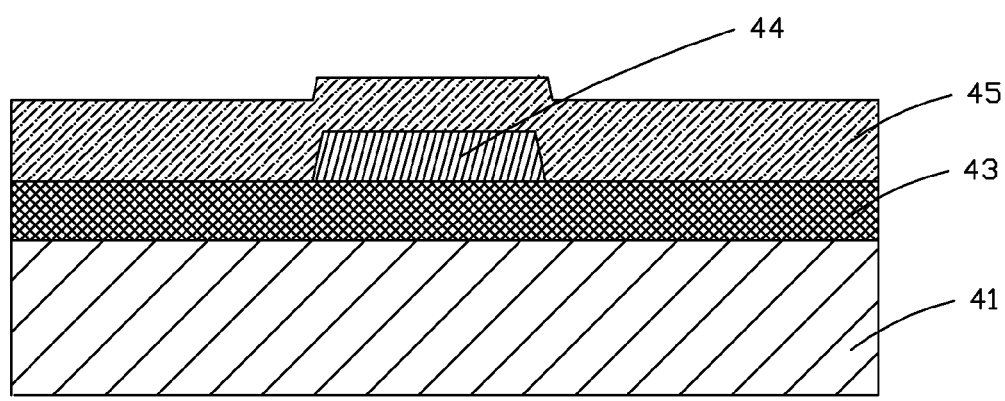
FIG. 6 is a cross section of B-B in FIG. 4.

Referring to FIG. 5, the gate line shorting bar 30 comprises a substrate 41, a first metal layer 42 forming on the substrate 41, a gate insulator 43 covering on the first metal layer 42 and the substrate 41 and a passivation layer 45 on the gate insulator 43. In the present embodiment, the first metal layer 42 of the gate line shorting bar 30 is produced at same layer and directly connected with the plurality of gate lines 22, convenient processing, improving the processing speed and cost saving. Similarly, referring to FIG. 6, the data line shorting bar 40 comprises a substrate 41, a gate insulator 43 forming on the substrate 41, a second metal layer 44 on the top of the gate insulator 43 and a passivation layer 45 covering on the second metal layer 44 and the gate insulator 43. In the present embodiment, the second metal layer 44 of the data line shorting bar 40 is produced at same layer and directly connected with the plurality data lines 24, convenient processing, improving the processing speed and cost saving. In this way, in the manufacturing process of the array substrate, especially when the insulating protective layer and the active layer perform the dry etching, it can greatly avoid the abnormal discharge of the plasma generated when the hole is formed cause static damage to the metal overlapping traces of the shorting bar, greatly playing the role of ESD protection, improving the product quality, increasing the production efficiency, reducing the production cost.

The gate insulating layer 43 is preferably formed by using a silicon deposition, the substrate 41 is preferably a glass substrate.

In summary, the anti-static structure of an array substrate in the present invention only utilize a gate line shorting bar to connect with all gate lines and a data line shorting bar to connect with all data lines, greatly briefing the shorting bar circuit, decreasing the number of shorting bar, reducing the number of the lighting signal in the cell process, furthermore, the first metal layer of the gate line shorting bar is produced at same layer and directly connected with the plurality of gate lines, thereby electrically connecting the gate line shorting bar and the plurality of gate lines, the second metal layer of the data line shorting bar is produced at same layer and directly connected with the plurality of the data lines, in this way, in the manufacturing process of the array substrate, especially when the insulating protective layer and the active layer perform the dry etching, it can greatly avoid the abnormal discharge of the plasma generated when the hole is formed cause static damage to the metal overlapping traces of the shorting bar, greatly playing the role of ESD protection, improving the product quality, increasing the production efficiency, reducing the production cost.

For the ordinary skilled person in this field, the above description can make various corresponding changes and modifications according to the technical aspect and concept of the present invention, those variations and modifications are considered encompassed in the scope of protection defined by the claims of the present invention.

What is claimed is:

1. An anti-static structure of an array substrate, which comprises an effective region of the array substrate, a gate line shorting bar provided on one side of the effective region and a data line shorting bar provided on the other side of the effective region, one side of the effective region where providing the gate line shorting bar being adjacent to the other side where providing the data line shorting bar, the effective region of the array substrate being provided with a plurality of parallel gate lines and data lines, the gate line shorting bar being electrically connected with one side of the plurality of gate lines, the data line shorting bar being electrically connected with one side of the plurality of data lines, wherein, the plurality of gate lines and the plurality data lines are perpendicular to each other, the beginning and the end of each gate lines and data lines are provided anti-static rings, the anti-static rings are provided around the effective region of the array substrate.

2. The anti-static structure of an array substrate as claimed in claim 1, wherein, all anti-static rings around the effective region of the array substrate are electrically connected together.

3. An anti-static structure of an array substrate, which comprises an effective region of the array substrate, a gate line shorting bar provided on one side of the effective region and a data line shorting bar provided on the other side of the effective region, one side of the effective region where providing the gate line shorting bar being adjacent to the other side where providing the data line shorting bar, the effective region of the array substrate being provided with a plurality of parallel gate lines and data lines, the gate line shorting bar being electrically connected with one side of the plurality of gate lines, the data line shorting bar being electrically connected with one side of the plurality of data lines, wherein the anti-static structure further comprises a plurality of first fan-out lines, a plurality of second fan-out lines, a plurality of data line contact pads and a plurality of gate line contact pads, one side of each first fan-out lines being electrically connected with a data line contact pad, the other end being electrically connected with a data line, one side of each second fan-out lines being electrically connected with a gate line contact pad, the other end being electrically connected with a gate line.

4. The anti-static structure of an array substrate as claimed in claim 3, wherein, the gate line shorting bar is electrically connected with each gate line contact pads to short all of the gate lines; the data line shorting bar is electrically connected with each data line contact pads to short all of the data lines.

5. An anti-static structure of an array substrate, which comprises an effective region of the array substrate, a gate line shorting bar provided on one side of the effective region and a data line shorting bar provided on the other side of the effective region, one side of the effective region where providing the gate line shorting bar being adjacent to the other side where providing the data line shorting bar, the effective region of the array substrate being provided with a plurality of parallel gate lines and data lines, the gate line shorting bar being electrically connected with one side of the plurality of gate lines, the data line shorting bar being electrically connected with one side of the plurality of data lines, wherein, the gate line shorting bar comprises a substrate, a first metal layer forming on the substrate, a gate insulator covering on the first metal layer and the substrate and a passivation layer on the gate insulator.

6. The anti-static structure of an array substrate as claimed in claim 5, wherein, the first metal layer of the gate line shorting bar is produced at same layer and directly connected with the plurality of gate lines, further electrically connecting the gate line shorting bar and the plurality of gate lines.

7. An anti-static structure of an array substrate, which comprises an effective region of the array substrate, a gate line shorting bar provided on one side of the effective region and a data line shorting bar provided on the other side of the effective region, one side of the effective region where providing the gate line shorting bar being adjacent to the other side where providing the data line shorting bar, the effective region of the array substrate being provided with a plurality of parallel gate lines and data lines, the gate line shorting bar being electrically connected with one side of the plurality of gate lines, the data line shorting bar being electrically connected with one side of the plurality of data lines, wherein, the data line shorting bar comprises a substrate, a gate insulator forming on the substrate, a second metal layer on the top of the gate insulator and a passivation layer covering on the second metal layer and the gate insulator.

8. The anti-static structure of an array substrate as claimed in claim 7, wherein, the second metal layer of the data line shorting bar is produced at same layer and directly connected with the plurality data lines, further electrically connecting the data line shorting bar and the plurality of data lines.

9. An anti-static structure of an array substrate, which comprises an effective region of the array substrate, a gate line shorting bar provided on one side of the effective region and a data line shorting bar provided on the other side of the effective region, one side of the effective region where providing the gate line shorting bar being adjacent to the other side where providing the data line shorting bar, the effective region of the array substrate being provided with a plurality of parallel gate lines and data lines, the gate line shorting bar being electrically connected with one side of the plurality of gate lines, the data line shorting bar being electrically connected with one side of the plurality of data lines, wherein, one end of the gate line shorting bar has a gate signal input pad, which is used to input the test signal; one end of the data line shorting bar has a data signal input pad, which is used to input the test signal.

10. An anti-static structure of an array substrate, which comprises an effective region of the array substrate, a gate line shorting bar provided on one side of the effective region and a data line shorting bar provided on the other side of the effective region, one side of the effective region where providing the gate line shorting bar being adjacent to the other side where providing the data line shorting bar, the effective region of the array substrate being provided with a plurality of parallel gate lines and data lines, the gate line shorting bar being electrically connected with one side of the plurality of gate lines, the data line shorting bar being electrically connected with one side of the plurality of data lines;

wherein, the plurality of gate lines and the plurality data lines are perpendicular to each other, the beginning and the end of each gate lines and data lines are provided anti-static rings, the anti-static ring is provided around the effective region of the array substrate;

wherein, all anti-static rings around the effective region of the array substrate are electrically connected together;

the anti-static structure further comprises a plurality of first fan-out lines, a plurality of second fan-out lines, a plurality of data line contact pads and a plurality of gate line contact pads, one side of each first fan-out lines being electrically connected with a data line contact pad, the other end being electrically connected with a data line, one side of each second fan-out lines being electrically connected with a gate line contact pad, the other end being electrically connected with a gate line;

wherein, the gate line shorting bar is electrically connected with each gate line contact pads to short all of the gate lines; the data line shorting bar is electrically connected with each data line contact pads to short all of the data lines;

wherein, the gate line shorting bar comprises a substrate, a first metal layer forming on the substrate, a gate insulator covering on the first metal layer and the substrate and a passivation layer on the gate insulator.

11. The anti-static structure of an array substrate as claimed in claim 10, wherein, the first metal layer of the gate line shorting bar is produced at same layer and directly connected with the plurality of gate lines, further electrically connecting the gate line shorting bar and the plurality of gate lines.

12. The anti-static structure of an array substrate as claimed in claim 10, wherein, the data line shorting bar comprises a substrate, a gate insulator forming on the substrate, a second metal layer on the top of the gate insulator and a passivation layer covering on the second metal layer and the gate insulator.

13. The anti-static structure of an array substrate as claimed in claim 12, wherein, the second metal layer of the data line shorting bar is produced at same layer and directly connected with the plurality data lines, further electrically connecting the data line shorting bar and the plurality of data lines.

14. The anti-static structure of an array substrate as claimed in claim 10, wherein, one end of the gate line shorting bar has a gate signal input pad, which is used to input the test signal; one end of the data line shorting bar has a data signal input pad, which is used to input the test signal.

* * * * *